United States Patent
Meadows

(10) Patent No.: US 11,754,635 B2
(45) Date of Patent: Sep. 12, 2023

(54) POWER UNIT TEST SYSTEM AND METHOD

(71) Applicant: RAI STRATEGIC HOLDINGS, INC., Winston-Salem, NC (US)

(72) Inventor: Jacob A. Meadows, McLeansville, NC (US)

(73) Assignee: RAI STRATEGIC HOLDINGS, INC., Winston-Salem, NC (US)

(*) Notice: Subject to any disclaimer, the term of this patent is extended or adjusted under 35 U.S.C. 154(b) by 285 days.

(21) Appl. No.: 16/509,744

(22) Filed: Jul. 12, 2019

(65) Prior Publication Data
US 2021/0011086 A1 Jan. 14, 2021

(51) Int. Cl.
*G01R 31/385* (2019.01)

(52) U.S. Cl.
CPC .................. *G01R 31/385* (2019.01)

(58) Field of Classification Search
CPC .. G01R 31/38; G01J 5/0014; H01M 10/4285; H01M 2220/30; A24F 40/80; H05B 1/0244
USPC .. 324/425–439, 500, 522, 525, 750.01, 600, 324/654, 658, 691
See application file for complete search history.

(56) References Cited

U.S. PATENT DOCUMENTS

| | | |
|---|---|---|
| 5,060,671 A | 10/1991 | Counts et al. |
| 5,388,594 A | 2/1995 | Counts et al. |
| 6,445,162 B1 | 9/2002 | Mukainakano |
| 8,079,371 B2 | 12/2011 | Robinson et al. |
| 8,881,737 B2 | 11/2014 | Collett et al. |
| 9,016,274 B1 | 4/2015 | White |
| 9,078,474 B2 | 7/2015 | Thompson |
| 9,854,841 B2 | 1/2018 | Ampolini et al. |
| 10,004,259 B2 | 6/2018 | Sebastian et al. |
| 10,117,460 B2 | 11/2018 | Sears et al. |
| 10,172,387 B2 | 1/2019 | Davis et al. |
| 2002/0100416 A1* | 8/2002 | Sun ............ B05B 7/0012 118/302 |
| 2013/0255702 A1 | 10/2013 | Griffith et al. |
| 2016/0050974 A1* | 2/2016 | Galloway ........ A24F 40/80 73/865.8 |
| 2019/0021397 A1 | 1/2019 | Zhang et al. |

(Continued)

FOREIGN PATENT DOCUMENTS

| | | |
|---|---|---|
| EP | 3 085 250 A1 | 10/2016 |
| WO | WO-2018/207887 A1 | 11/2018 |

OTHER PUBLICATIONS

International Search Report and Written Opinion in PCT/US2020/041365, dated Nov. 19, 2020, 15 pages.

*Primary Examiner* — Patrick Assouad
*Assistant Examiner* — Trung Q Nguyen
(74) *Attorney, Agent, or Firm* — BURR & FORMAN LLP

(57) ABSTRACT

A system for testing a aerosol delivery device includes a test fixture configured to couple to a power unit for an aerosol delivery device and a vacuum source configured to fluidly couple to the power unit. The vacuum source induces a vacuum within the power unit. A power storage device is configured to electrically couple to the power unit, the power storage device configured to store power provided by the power unit. A power measurement device is electrically coupled to the power storage device, and the power measurement device is configured to measure the power stored in the power storage device.

22 Claims, 6 Drawing Sheets

(56) References Cited

U.S. PATENT DOCUMENTS

2019/0120769 A1* 4/2019 Strasser, Jr. .......... G01N 21/783
2019/0373958 A1 12/2019 Watanabe et al.
2019/0387795 A1* 12/2019 Fisher .................... A24F 40/53

* cited by examiner

POWER UNIT TEST SYSTEM AND METHOD

TECHNICAL FIELD

The present disclosure relates to methods for testing power components of aerosol delivery devices. More particularly, the present disclosure relates to methods for verifying the available power in a power component of an aerosol delivery device.

BACKGROUND

Many smoking devices have been proposed through the years as improvements upon, or alternatives to, smoking products that require combusting tobacco for use. Many of those devices have been designed to provide the sensations associated with cigarette, cigar, or pipe smoking, but without delivering considerable quantities of incomplete combustion and pyrolysis products that result from the burning of tobacco. To this end, there have been proposed numerous smoking products, flavor generators, and medicinal inhalers that utilize electrical energy to vaporize or heat a volatile material, or attempt to provide the sensations of cigarette, cigar, or pipe smoking without burning tobacco to a significant degree. For example, various alternative smoking articles, aerosol delivery devices and heat generating sources are set forth in the background art described in U.S. Pat. App. Pub. No. 2013/0255702 to Griffith Jr. et al., U.S. Pat. No. 10,004,259 to Sebastian et al., U.S. Pat. No. 5,060,671 to Counts et al.; U.S. Pat. No. 9,016,274 to White; U.S. Pat. No. 9,078,474 to Thompson; U.S. Pat. No. 8,881,737 to Collett et al., U.S. Pat. No. 10,117,460 to Sears et al., U.S. Pat. No. 9,854,841 to Ampolini et al., and U.S. Pat. No. 10,172,387 to Davis et al., which are incorporated herein by reference in their entireties. Other various embodiments of products and heating configurations are described in the background sections of U.S. Pat. No. 5,388,594 to Counts et al. and U.S. Pat. No. 8,079,371 to Robinson et al., which are incorporated by reference in their entireties.

Popular electronic or electrically powered smoking articles (e.g., electronic cigarettes, E-cigarettes, etc.) (referred to herein collectively as "aerosol delivery devices") often include a liquid storage component for storing aerosol precursor material (e.g., aerosol forming agent, liquid smoke, etc.), a vaporizing chamber with a heating coil attached for the aerosol precursor material to become vaporized therein, and a battery to power the device. The heating coil material typically includes a nickel/chromium wire, a titanium wire, nichrome wire, or similar alloy wires. The aerosol precursor material typically includes a mixture of propylene glycol, glycerin, nicotine, water and flavoring. Various electronic smoking articles have a single device which houses both the heating element and the aerosol precursor material in one unit, commonly referred to as a cartomizer.

Certain tobacco products that have employed electrical energy to produce heat for smoke or aerosol formation. In particular, certain products that have been referred to as electronic cigarette products or electronic smoking articles have been commercially available throughout the world. Representative products that resemble many of the attributes of traditional types of cigarettes, cigars or pipes have been marketed as ACCORD® by Philip Morris Incorporated; ALPHA™, JOYE 510™ and M4™ by InnoVapor LLC; CIRRUS™ and FLING™ by White Cloud Cigarettes; COHITA™, COLIBRI™, ELITE CLASSIC™, MAGNUM™, PHANTOM™ and SENSE™ by Epuffer® International Inc.; DUOPRO™, STORM™ and VAPORKING® by Electronic Cigarettes, Inc.; EGAR™ by Egar Australia; eGo-C™ and eGo-T™ by Joyetech; ELUSION™ by Elusion UK Ltd; EONSMOKE® by Eonsmoke LLC; GREEN SMOKE® by Green Smoke Inc. USA; GREENARETTE™ by Greenarette LLC; HALLIGAN™ HENDU™ JET™, MAXXQ™ PINK™ and PITBULL™ by Smoke Stik®; HEATBAR™ by Philip Morris International, Inc.; HYDRO IMPERIAL™ and LXE™ from Crown7; LOGIC™ and THE CUBAN™ by LOGIC Technology; LUCI® by Luciano Smokes Inc.; METRO® by Nicotek, LLC; NJOY® and ONEJOY™ by Sottera, Inc.; NO. 7™ by SS Choice LLC; PREMIUM ELECTRONIC CIGARETTE™ by PremiumEstore LLC; RAPP E-MYSTICK™ by Ruyan America, Inc.; RED DRAGON™ by Red Dragon Products, LLC; RUYAN® by Ruyan Group (Holdings) Ltd.; SMART SMOKER® by The Smart Smoking Electronic Cigarette Company Ltd.; SMOKE ASSIST® by Coastline Products LLC; SMOKING EVERYWHERE® by Smoking Everywhere, Inc.; V2CIGS™ by VMR Products LLC; VAPOR NINE™ by VaporNine LLC; VAPOR4LIFE® by Vapor 4 Life, Inc.; VEPPO™ by E-CigaretteDirect, LLC and VUSE® by R. J. Reynolds Vapor Company. Yet other electrically powered aerosol delivery devices, and in particular those devices that have been characterized as so-called electronic cigarettes, have been marketed under the tradenames BLU™; COOLER VISIONS™; DIRECT E-CIG™; DRAGONFLY™; EMIST™; EVERSMOKE™; GAMUCCI®; HYBRID FLAME™; KNIGHT STICKS™; ROYAL BLUES™; SMOKETIP® and SOUTH BEACH SMOKE™. In some of these electronic smoking articles, when the user inhales on the electronic smoking article, aerosol precursor material is 'pulled' from the reservoir into a vaporizing chamber using gravity and capillary in the wick. The aerosol precursor material is either adsorbed or resting on the electronic smoking article's heating apparatus and heated until it becomes vapor. The vapor is drawn away from the heated region of the device, where it subsequently cools and condenses into a high number density, generally sub-micron aerosol whereupon it then exits the device. The wick material can include any combination of silica, organic cotton, cellucotton rayon fibers, stainless steel, fiberglass, ceramic, and other materials with similar properties.

Electronic cigarette products require a power source to generate the electrical energy to produce heat and/or smoke. The power source is generally in the form of a battery housed in a power unit of the electronic cigarette. As the available power in a battery can decrease over time, it may be desirable to test the remaining power in the power source. Additional electrical components within the power unit can modulate the power from the power source, making it difficult to accurately measure the available power in the power source without removing the power source from the power unit.

SUMMARY

One embodiment relates to a system for testing an aerosol delivery device. The system includes a test fixture configured to couple to a power unit for the aerosol delivery device and a vacuum source configured to fluidly couple to the power unit. The vacuum source induces a vacuum within the power unit. A power storage device is configured to electrically couple to the power unit, the power storage device configured to store power provided by the power unit. A power measurement device is electrically coupled to the power storage device, and the power measurement device is configured to measure the power stored in the power storage device.

Another embodiment relates to a system for testing an aerosol delivery device. The system includes a test fixture configured to couple to a power unit for the aerosol delivery device. The system further includes a vacuum source configured to fluidly couple to the power unit, where the vacuum source is configured to induce a vacuum within the power unit. A power measurement device is configured to electrically couple to the power unit, and the power measurement device is configured to measure the power provided by the power unit.

Still another embodiment relates to a method for verifying an aerosol delivery device testing system. The method comprises coupling a power unit of an aerosol delivery device to a test fixture, the power unit comprising a power source and a flow sensor. The method further includes activating the power unit and measuring, by a power measurement device, an amount of power remaining in the power unit. The power measurement device measures an amount of power remaining in the power source. The method further includes, if the measured amount power remaining in the power source is within a predetermined amount of the measured amount of power remaining in the power unit, indicating that the method is valid.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several implementations in accordance with the disclosure and are therefore not to be considered limiting of its scope, the disclosure will be described with additional specificity and detail through use of the accompanying drawings. Exemplary embodiments of the present application will now be described, by way of example only, with reference to the accompanying drawings, which are not necessarily drawn to scale, and wherein:

DETAILED DESCRIPTION

Referring generally to the figures, a system for testing a power unit of an aerosol delivery device is shown. An example of an aerosol delivery device is an e-cigarette. An e-cigarette producer may produce an abundance of power units for inclusion in e-cigarettes during a manufacturing process. The power units include a power source to power the e-cigarette. As used herein, the term "power source" refers to any type of device or system that can provide power (e.g., a battery). Over time, the supply of power in the power source may diminish, thereby reducing the function of the e-cigarette in which it is installed. Manufacturers may therefore desire to test the power units before assembly to determine whether the supply of power in the power unit is sufficient. To test the supply of power, the power unit must be electrically connected to a power measurement device. However, because many power units include additional components that modulate the power flowing from the power unit, connecting the power unit directly to the power measurement device can result in inaccurate power supply readings.

A testing system according to various embodiments comprises a test fixture operatively coupled to a power unit, a power measurement device, and a vacuum source. The test fixture includes a power storage device operatively coupled to both the power storage device and the power unit. The test fixture further includes one or more vacuum lines operatively coupled to the vacuum source, the power unit, and a cartridge. As used herein, the term "vacuum" refers to a drop in pressure imparted via suction. For example, a drop in pressure can be imparted by a user drawing on an aerosol delivery device.

Figure 1:
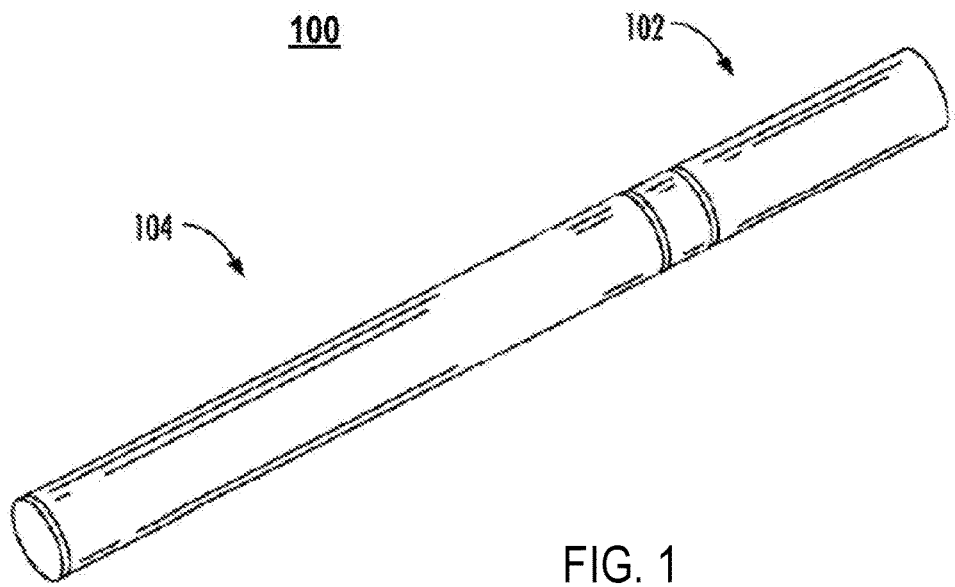
FIG. 1 illustrates a perspective view of an aerosol delivery device, according to a particular embodiment.

Referring to FIG. 1, an illustration of a perspective view of an example aerosol delivery device 100 is shown, according to a particular embodiment. The aerosol delivery device 100 includes a power unit 104 and a cartridge 102. The power unit 104 and the cartridge 102 can be configured to engage one another by a variety of connections, such as a press fit (or interference fit) connection, a threaded connection, a magnetic connection, or the like. As such, the power unit 104 may include a first engaging element (e.g., a coupler) that is adapted to engage a second engaging element (e.g., a connector) on the cartridge 102. The first engaging element and the second engaging element may be reversible. As an example, either of the first engaging element or the second engaging element may be a male thread, and the other may be a female thread. As a further example, either the first engaging element or the second engaging element may be a magnet, and the other may be a metal or a matching magnet. In particular implementations, engaging elements may be defined directly by existing components of the power unit 104 and the cartridge 102. For example, the housing of the power unit 104 may define a cavity at an end thereof that is configured to receive at least a portion of the cartridge 102 (e.g., a storage tank or other shell-forming element of the cartridge 102). In particular, a storage tank of the cartridge 102 may be at least partially received within the cavity of the power unit 104 while a mouthpiece of the cartridge 102 remains exposed outside of the cavity of the power unit 104. The cartridge 102 may be retained within the cavity formed by the housing, such as by an interference fit (e.g., through use of detents and/or other features creating an interference engagement between an outer surface of the cartridge 102 and an interior surface of a wall forming the cavity), by a magnetic engagement (e.g., though use of magnets and/or magnetic metals positioned within the cavity of the power unit 104 and positioned on the cartridge 102), or by other suitable techniques.

Figure 2:
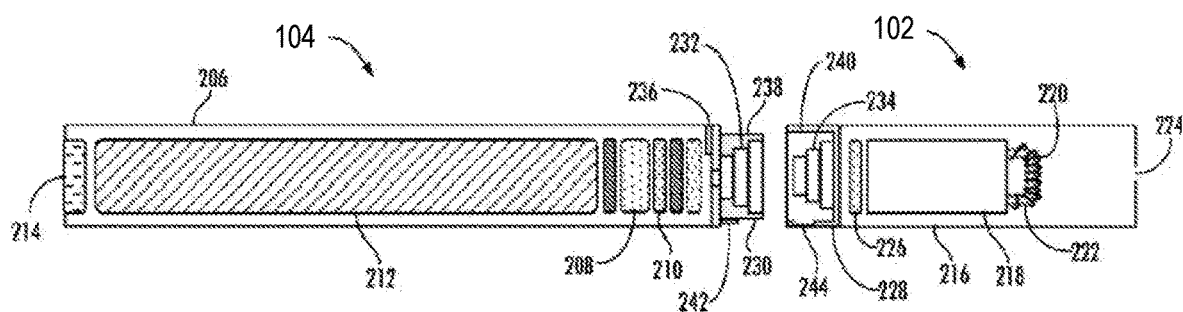
FIG. 2 is a cross-sectional view of the aerosol delivery device of FIG. 1.

Referring now to FIG. 2, a cross-sectional view of the aerosol delivery device 100 of FIG. 1 is shown. The power unit 104 and cartridge 102 each include a number of respective components. The components illustrated in FIG. 2 are representative of the components that may be present in a power unit 104 and cartridge 102 and are not intended to limit the scope of components that are encompassed by the present disclosure. As shown, for example, the power unit 104 can be formed of a housing 206 (sometimes referred to as a control body shell) that can include a control component 208 (e.g., processing circuitry, etc.), a flow sensor 210, a power source 212 (e.g., battery, supercapacitor), and an indicator 214 (e.g., LED, quantum dot-based LED), and such components can be variably aligned. The power source 212 may be rechargeable, and the control component 208 may include a switch and processing circuitry coupled to the flow sensor 210 and the switch. In one embodiment, the power unit 104 may be referred to as a battery portion.

The flow sensor 210 may comprise any sensor(s) configured to detect a flow of air, such as due to detection or measurement of flow of air past the sensor 210 and/or as a result of a detected drop in pressure, such as may result from a partial vacuum effect imparted by a user drawing on the aerosol delivery device 100. In some embodiments in which the flow sensor 210 is embodied as a pressure sensor, flow of air may, for example, be detected based on a drop in actual pressure measured by the sensor relative to an ambient air pressure.

The cartridge 102 can be formed of a housing 216 (sometimes referred to as the cartridge shell) enclosing a reservoir 218 configured to retain the aerosol precursor composition, and including a heating element 220 (aerosol production component). In various configurations, this structure may be referred to as a tank; and accordingly, the terms "cartridge," "tank" and the like may be used interchangeably to refer to a shell or other housing enclosing a reservoir for aerosol precursor composition, and including a heating element.

As shown, in some examples, the reservoir 218 may be in fluid communication with a liquid transport element 222 adapted to wick or otherwise transport an aerosol precursor composition stored in the reservoir 218 to the heating element 220. In some examples, a valve may be positioned between the reservoir 218 and heating element 220, and configured to control an amount of aerosol precursor composition passed or delivered from the reservoir 218 to the heating element 220.

Various examples of materials configured to produce heat when electrical current is applied therethrough may be employed to form the heating element 220. The heating element 220 in these examples may be a resistive heating element such as a wire coil, micro heater or the like. Example materials from which the heating element 220 may be formed include Kanthal (FeCrAl), nichrome, nickel, stainless steel, indium tin oxide, tungsten, molybdenum disilicide ($MoSi_2$), molybdenum silicide (MoSi), molybdenum disilicide doped with aluminum ($Mo(Si,Al)_2$), titanium, platinum, silver, palladium, alloys of silver and palladium, graphite and graphite-based materials (e.g., carbon-based foams and yarns), conductive inks, boron doped silica, and ceramics (e.g., positive or negative temperature coefficient ceramics). The heating element 220 may be a resistive heating element or a heating element configured to generate heat through induction. The heating element 220 may be coated by heat conductive ceramics such as aluminum nitride, silicon carbide, beryllium oxide, alumina, silicon nitride, or their composites. Example implementations of heating elements useful in aerosol delivery devices according to the present disclosure are further described below, and can be incorporated into devices such as those described herein.

An opening 224 may be present in the housing 216 (e.g., at the mouth end) to allow for egress of formed aerosol from the cartridge 102.

The cartridge 102 also may include one or more electronic components 226, which may include an integrated circuit, a memory component (e.g., EEPROM, flash memory), a sensor, or the like. The electronic components 226 may be adapted to communicate with the control component 208 and/or with an external device by wired or wireless means. The electronic components 226 may be positioned anywhere within the cartridge 102 or a base 228 thereof.

Although the control component 208 and the flow sensor 210 are illustrated separately, it is understood that various electronic components including the control component 208 and the flow sensor 210 may be combined on a circuit board (e.g., PCB) that supports and electrically connects the electronic components 226. Further, the circuit board may be positioned horizontally relative the illustration of FIG. 1 in that the circuit board can be lengthwise parallel to the central axis of the power unit 104. In some examples, the air flow sensor may comprise its own circuit board or other base element to which it can be attached. In some examples, a flexible circuit board may be utilized. A flexible circuit board may be configured into a variety of shapes, include substantially tubular shapes. In some examples, a flexible circuit board may be combined with, layered onto, or form part or all of a heater substrate.

The power unit 104 and the cartridge 102 may include components adapted to facilitate a fluid engagement therebetween. As illustrated in FIG. 2, the power unit 104 can include a coupler 230 having a cavity 232 therein. The base 228 of the cartridge 102 can be adapted to engage the coupler 230 and can include a projection 234 adapted to fit within the cavity 232. Such engagement can facilitate a stable connection between the power unit 104 and the cartridge 102 as well as establish an electrical connection between the power source 212 and control component 208 in the power unit 104 and the heating element 220 in the cartridge 102. Further, the housing 206 can include an air intake 236, which may be a notch in the housing 206 where it connects to the coupler 230 that allows for passage of ambient air around the coupler 230 and into the housing 206 where it then passes through the cavity 232 of the coupler 230 and into the cartridge 102 through the projection 234.

A coupler and a base useful according to the present disclosure are described in U.S. Pat. No. 9,609,893 to Novak et al., which is incorporated herein by reference. For example, the coupler 230 as seen in FIG. 2 may define an outer periphery 238 configured to mate with an inner periphery 240 of the base 228. In one example the inner periphery 240 of the base 228 may define a radius that is substantially equal to, or slightly greater than, a radius of the outer periphery 238 of the coupler 230. Further, the coupler 230 may define one or more protrusions 242 at the outer periphery 238 configured to engage one or more recesses 244 defined at the inner periphery 240 of the base 228. However, various other examples of structures, shapes and components may be employed to couple the base 228 to the coupler 230. In some examples the connection between the base 228 of the cartridge 102 and the coupler 230 of the power unit 104 may be substantially permanent, whereas in other examples the connection therebetween may be releasable such that, for example, the power unit 104 may be reused with one or more additional cartridges 102 that may be disposable and/or refillable.

The reservoir 218 illustrated in FIG. 2 can be a container or can be a fibrous reservoir, as presently described. For example, the reservoir 218 can comprise one or more layers of nonwoven fibers substantially formed into the shape of a tube encircling the interior of the housing 216, in this example. An aerosol precursor composition can be retained in the reservoir 218. Liquid components, for example, can be sorptively retained by the reservoir 218. As another example, the reservoir 218 may define a tank in which liquid aerosol precursor composition can be retained. The reservoir 218 can be in fluid connection with the liquid transport element 222. The liquid transport element 222 can transport the aerosol precursor composition stored in the reservoir 218 via capillary action—or via a micro pump—to the heating element 220 that is in the form of a metal wire coil in this example. As such, the heating element 220 is in a heating arrangement with the liquid transport element 222.

In some examples, a microfluidic chip may be embedded in the reservoir 218, and the amount and/or mass of aerosol precursor composition delivered from the reservoir 218 may be controlled by a micro pump, such as one based on microelectromechanical systems (MEMS) technology. Other example implementations of reservoirs and transport elements useful in aerosol delivery devices according to the present disclosure are further described herein, and such reservoirs and/or transport elements can be incorporated into devices such as those described herein. In particular, specific combinations of heating members and transport elements as further described herein may be incorporated into devices such as those described herein.

In use, when a user draws on the aerosol delivery device 100, airflow is detected by the flow sensor 210, and the heating element 220 is activated to vaporize components of the aerosol precursor composition. Drawing upon the mouth end of the aerosol delivery device 100 causes ambient air to enter the air intake 236 and pass through the cavity 232 in the coupler 230 and the central opening in the projection 234 of the base 228. In the cartridge 102, the drawn air combines with the formed vapor to form an aerosol. The aerosol is whisked, aspirated or otherwise drawn away from the heating element 220 and out the opening 224 in the mouth end of the aerosol delivery device 100.

For further detail regarding implementations of an aerosol delivery device including a control body and a cartridge in the case of an electronic cigarette, see U.S. patent application Ser. No. 15/836,086 to Sur; and U.S. patent application Ser. No. 15/916,834 to Sur et al.; as well as U.S. patent application Ser. No. 15/916,696 to Sur, filed Mar. 9, 2018, which is also incorporated herein by reference.

It will be appreciated that the aerosol delivery device 100 is provided by way of example and not by way of limitation. Further, it will be appreciated that embodiments described herein may be applied not just to aerosol delivery devices that function as electronic nicotine delivery systems, such as through use of a nicotine containing aerosol precursor solution, but to aerosol delivery devices that may be used to deliver any active ingredient, including, for example, botanical ingredients (e.g., lavender, peppermint, chamomile, basil, rosemary, thyme, eucalyptus, ginger, cannabis, ginseng, maca, and tisanes), stimulants (e.g., caffeine and guarana), amino acids (e.g., taurine, theanine, phenylalanine, tyrosine, and tryptophan) and/or pharmaceutical, nutraceutical, and medicinal ingredients (e.g., vitamins, such as B6, B12, and C and cannabinoids, such as tetrahydrocannabinol (THC) and cannabidiol (CBD)).

Figure 3:
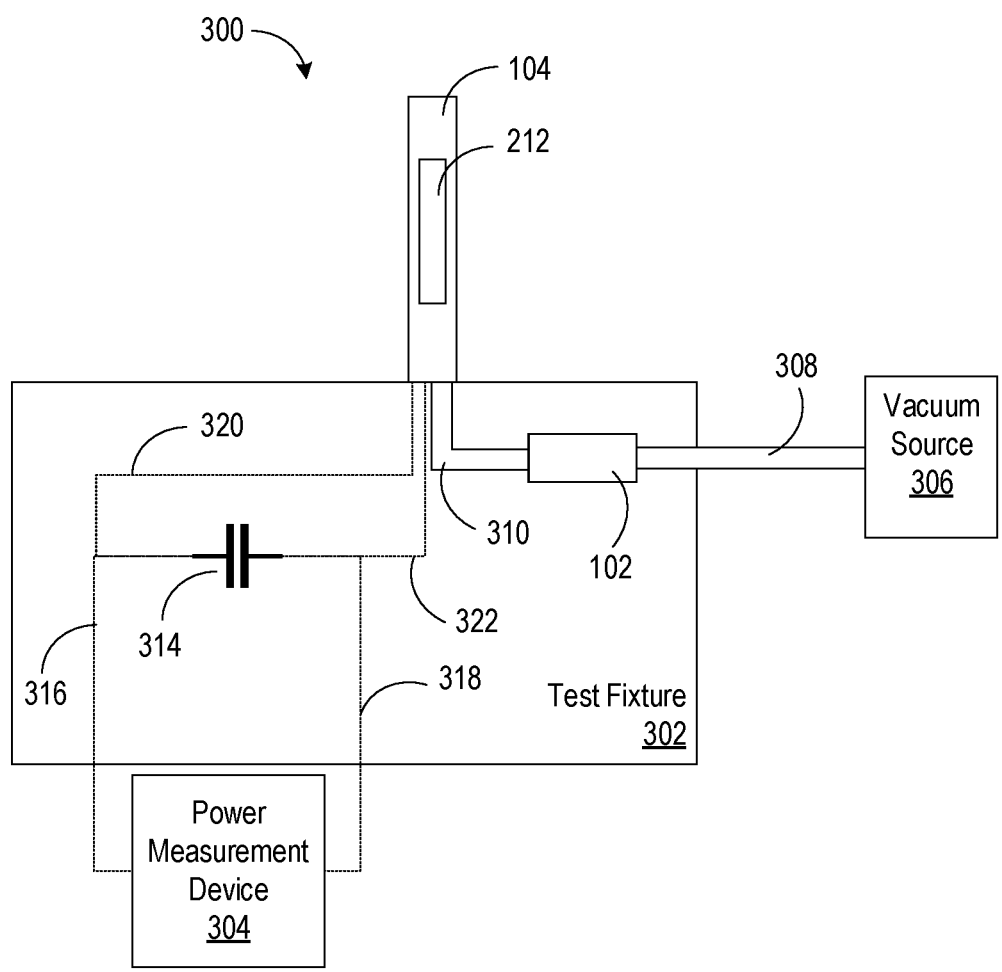
FIG. 3 is a block diagram of a power unit testing device, according to a particular embodiment.

Referring to FIG. 3, a block diagram of a power unit testing device 300 is shown, according to a particular embodiment. The power unit testing device 300 includes a test fixture 302, a power measurement device 304, and a vacuum source 306. The test fixture 302 can comprise any mechanical structure configured to contain and/or secure components of the testing device 300. The power measurement device 304 can be any type of device operable to couple to an electrical device or an electrical circuit, measure the power in the electrical device or circuit, provide an output regarding the power (e.g., the voltage, current, or any other property indicative of the power available), and display the output on a visible display. Examples of the power measurement device 304 include, but are not limited to, multimeters, ammeters, and voltmeters. The vacuum source 306 can be any type of device or system operable to induce a vacuum (e.g., a negative pressure). An example of the vacuum source 306 is a vacuum pump.

In some embodiments, the power measurement device 304 can provide the output regarding the power in a variety of ways. For example, the power measurement device 304 may be configured to communicate wirelessly with a computing device such as a laptop computer or a mobile device (e.g., a mobile phone, a tablet computer, or other mobile devices capable of connecting wirelessly), and the computing device can display the results. The power measurement device 304 can include a communication circuit to allow the power measurement device 304 to communicate directly with other devices. The power measurement device 304 may also be electronically coupled to a communication interface configured to send the power measurement data over a network. As another example, the power measurement device 304 can provide the output to a database that includes the results of a plurality of measurements from a plurality of power units 104. The power measurement device 304 may read a unique identifier (e.g., a serial number, a bar code, a radio frequency identification chip, an engraving, or a unique electrical identifier provided via communication with a memory or a controller on the power unit 104) on the power unit 104 such that when the results are provided to the database, the results of the measurement are associated with the power unit 104 in the database. The power measurement device 304 may also be coupled to a circuit within the test fixture 302 (not shown), the circuit being programmed with acceptable and unacceptable power levels. The circuit may be coupled to a plurality of lights visible to a user (e.g., a red light, a green light, and a yellow light). Upon testing the power unit 104, the circuit of some such embodiments analyzes the incoming data and provides the user with feedback regarding the power remaining in the power unit 104. For example, the green light will be illuminated if the power remaining is acceptable, the red light will be illuminated if the power remaining is unacceptable, and the yellow light will be illuminated if the power remaining indicates charging the power unit 104 will place the power unit 104 in the acceptable range.

The test fixture 302 further includes a power storage device 314. The power storage device 314 can be any type of device or system operable to store an electrical charge. An example of the power storage device 314 is a capacitor. The power storage device 314 is electrically coupled to the power measurement device 304 via a first lead 316 and a second lead 318. The power storage device 314 is further electrically coupled to the power unit 104 via a third lead 320 and a fourth lead 322. The power unit 104 is operatively coupled to the test fixture 302. In some embodiments, the power unit 104 is coupled directly to the test fixture 302. The power unit 104 may also be coupled to the test fixture 302 by an adaptor (not shown) configured to couple the power unit 104 to the components inside the text fixture 302. In some embodiments, one or more adaptors of varying shapes and sizes can be removably coupled to the test fixture 302 such that power units of corresponding shapes and sizes can be tested using the test fixture 302. In this regard, adaptors may be interchangeably engaged with the test fixture 302 of some embodiments to enable testing of a variety of different types and sizes of power units 104. In either configuration, the third lead 320 and the fourth lead 322 are electrically coupled to the power unit 104 such that the power unit 104 is in electrical communication with the power storage device 314.

The test fixture 302 also includes the cartridge 102 fluidly coupled to the vacuum source 306 via a first vacuum line 308. The cartridge 102 is fluidly coupled to the power unit 104 of an aerosol delivery device via a second vacuum line 310. The first vacuum line 308 and the second vacuum line 310 may be substantially circular in cross-section and provide a conduit through which the vacuum source 306 induces a vacuum in both the cartridge 102 and the power unit 104. The first vacuum line 308 and the second vacuum line 310 may be manufactured from any material suitable to withstand a vacuum. In some implementations, one or more of the first vacuum line 308 and the second vacuum line 310 may include one or more restrictors (not shown) to restrict the amount of vacuum that reaches the power unit 104. The amount of vacuum may be restricted to approximate the amount of vacuum induced when a user inhales. The restrictors may also protect the internal components of the power unit 104 and the cartridge 102, as the internal components may be designed and/or optimized to operate when exposed to a vacuum similar to a vacuum induced by a user inhaling. In embodiments where air flow within the power unit 104 is detected in lieu of, or in addition to, a pressure, the first vacuum line 308 and the second vacuum line 310 may be used to impart a flow of air over a flow sensor.

In operation, a manufacturer or distributor may desire to test the power remaining in the power unit 104. In some embodiments, the power unit 104 may include a device to modulate the pulse width of the power from the power source 212. Such modulation oscillates the voltage on and off at a high rate such that directly connecting the power unit 104 to the power measurement device 304 would not provide an accurate reading of the power remaining in the power unit 104. Accordingly, the manufacturer connects the power unit 104 to the test fixture 302 such that the power unit 104 is electrically coupled to the power storage device 314. Coupled in this manner, the power available in the power source 212 is represented by the electrical charge accumulated by the power storage device 314. In embodiments where the power storage device 314 is a capacitor, the power storage device 314 may store the power from the power unit 104 in the form of an electrical charge. In such embodiments, the charge stored on the power storage device 314 will remain constant even though the power from the power unit 104 is modulated. The constant charge stored on the power storage device 314 can be measured by the power measurement device 304 to provide an accurate reading of the remaining power on the power unit 104.

In some arrangements, the power unit 104 includes one or more sensors (not shown), such as the flow sensor 210 (which is illustrated as a component of the power unit 104 in FIG. 2), that detect the presence of a vacuum. When the presence of a vacuum is detected (e.g., when a user inhales when using an electronic cigarette), the sensor notifies the power unit 104 to provide power to the cartridge 102 such that the liquid in the cartridge 102 is heated to create the vapor. In such arrangements, the power unit 104 is fluidly coupled to the vacuum source 306 such that when the vacuum source 306 induces a vacuum, the power unit 104 activates the power source 212. When the power source 212 is activated, the power available in the power source 212 is represented by the electrical charge accumulated by the power storage device 314 such that the remaining power can be measured with the power measurement device 304.

The power unit 104 may need to be electrically coupled to the cartridge 102 in order to be activated (e.g., a sensor in the power unit 104 may determine whether the cartridge 102 is electrically coupled to the power unit 104). Such an electrical coupling can prevent the power unit 104 from turning on when a user is not using the aerosol delivery device 100 (e.g., when a user is replacing the liquid in the cartridge 102 and separates the cartridge 102 from the power unit 104). In embodiments where the power unit 104 and the cartridge 102 must be electrically coupled for the power unit 104 to be activated, the cartridge 102 is included in the test fixture 102 and is electrically coupled to the power unit 104 (e.g. via electrical leads or any other suitable electrical connection). When the vacuum source 306 is activated, the vacuum is induced through the first vacuum line 308, the cartridge 102, the second vacuum line 310, and the power unit 104. The flow sensor in the power unit 104 detects the vacuum and notifies the power unit 104 to turn on. If the power unit 104 verifies that the power unit 104 is electrically coupled to the cartridge 102, the power unit 104 turns on and provides power to the power storage device 314 such that the power remaining in the power source 212 can be measured by the power measurement device 304.

To verify that the power unit testing device 300 provides for the power measurement device 304 to accurately measure the power remaining in the power source 212, the power source 212 is removed from the power unit 104 and connected to the power measurement device 304. For example, the power measurement device 304 can be disconnected from the power storage device 314, and the power source 212 can be removed from the power unit 104 and connected to the power measurement device 304 using electrical leads similar to the first lead 316 and the second lead 318. When the power source 212 is connected to the power measurement device 304, the power remaining in the power source 212 can be measured by the power measurement device 304. If the power remaining in the power source 212 when measured directly by the power measurement device 304 is within a predetermined amount (e.g., within 1 millivolt) of the power remaining in the power source 212 as measured via the power unit testing device 300, the power unit testing device 300 is verified. Accordingly, measurements of power remaining on subsequently tested devices can be relied upon to accurately reflect the amount of power remaining.

In some embodiments, the test fixture 302 can be arranged to test multiple power units 104 concurrently. In such embodiments, the test fixture 302 can include multiple adaptors to accommodate the power units 104 being tested. The power units 104 tested concurrently may be of the same size and shape, and thereby require adaptors of the same size and shape. In some instances, the power units 104 tested concurrently may be of different sizes and shapes, and thereby require adaptors of different sizes and shapes to accommodate the different power units 104.

Each power unit 104 being tested may be coupled to a power storage device 314 dedicated to a single power unit 104. As such, the test fixture 302 includes the same number of power storage devices 314 as the number of power units 104 the test fixture 302 can accommodate. Each power storage device 314 is coupled to the power measurement device 304. In embodiments where the power storage device is coupled to multiple power storage devices 314, the power measurement device 304 can include a plurality of input channels such that the charge stored in each of the power storage devices 314 can be displayed on the power storage device 304 or by any of the other display arrangements described above.

The vacuum source 306 provides suction through the first vacuum line 308. To accommodate a plurality of power units 104 being tested, the first vacuum line 308 may be split in to a number of branches within the test fixture 302 equaling the number of power units 104 being tested, with each branch being associated with one power unit 104. Each branch may include a cartridge 102 and a second vacuum line 310 coupled to the cartridge 102 and the power unit 104 such that the suction from the vacuum source 306 is imparted to each of the power units 104. Accordingly, the performance of a plurality of power units 104 can be tested concurrently.

Figure 4:
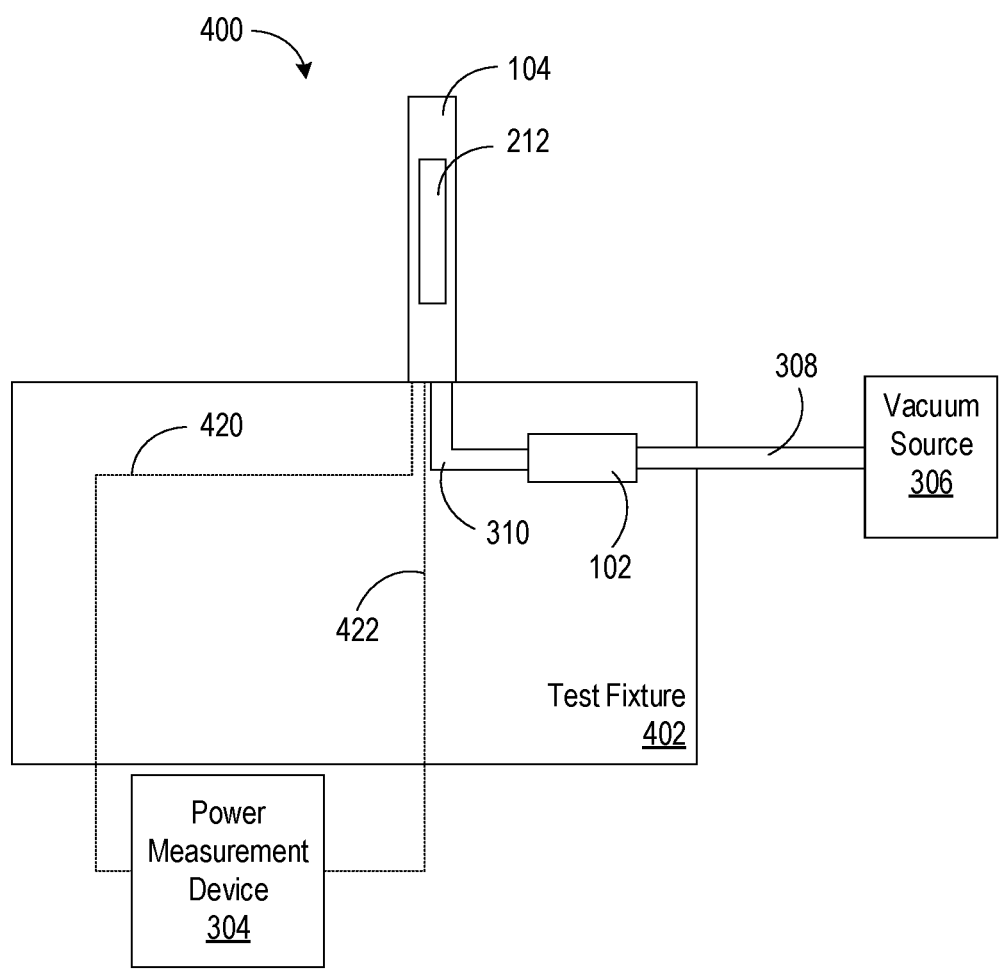
FIG. 4 is a block diagram of a power unit testing device, according to another embodiment.

Referring to FIG. 4, a block diagram of another power unit testing device 400 is shown, according to a particular embodiment. The power unit testing device 400 includes a test fixture 402, the power measurement device 304, and the vacuum source 306. The test fixture 402 can comprise any mechanical structure configured to contain and/or secure components of the testing device 400. The test fixture 402 includes the cartridge 102, the first vacuum line 308, the second vacuum line 310, a first lead 420, and a second lead 422. The first lead 420 and the second lead 422 are electrically coupled to both the power unit 104 and the power measurement device 304.

In some embodiments, the power unit 104 does not include any electrical modulation devices that create difficulty in directly measuring the power remaining in the power source 212. Accordingly, the power measurement device 304 can be directly coupled to the power unit 104 to provide a measurement of the power remaining in the power source 212.

In operation, a user desiring to test the power remaining in the power unit 104 couples the power unit 104 to the test fixture 402. The power unit 104 can be coupled to the test fixture 402 directly. In some embodiments, the power unit 104 is coupled to the test fixture 402 indirectly (e.g., via an adaptor configured to receive the power unit 104 and couple with the vacuum line 310 and the first lead 420 and second lead 422). In some embodiments, one or more adaptors of varying shapes and sizes can be removably coupled to the test fixture 302 such that power units of corresponding shapes and sizes can be tested using the test fixture 302. To activate the power unit 104, the user turns on the vacuum source 306 to induce a vacuum. In some instances, one or more of the first vacuum line 308 and the second vacuum line 310 may include one or more restrictors (not shown) to restrict the amount of vacuum that reaches the power unit 104. The amount of vacuum may be restricted to approximate the amount of vacuum induced when a user inhales. The restrictors may also protect the internal components of the power unit 104 and the cartridge 102, as the internal components may be designed and/or optimized to operate when exposed to a vacuum similar to a vacuum induced by a user inhaling.

In embodiments where the power unit 104 includes a flow sensor such as the flow sensor 210 (which is illustrated as a component of the power unit 104 in FIG. 2), when the flow sensor detects the presence of a vacuum, the flow sensor sends a signal to the power unit 104 to activate the power source 212. When the power source 212 is activated, the power measurement device 304 measures the power remaining in the power source 212. The power unit testing device 400 can be verified as described.

In some embodiments, the test fixture 402 can be arranged to test a plurality of power units 104 concurrently, as described with reference to FIG. 3. Because the test fixture 402 does not include a power storage device 314 like the test fixture 302, modifying the test fixture 402 to accommodate a plurality of power units 104 does not require providing power storage devices 314.

Figure 5:
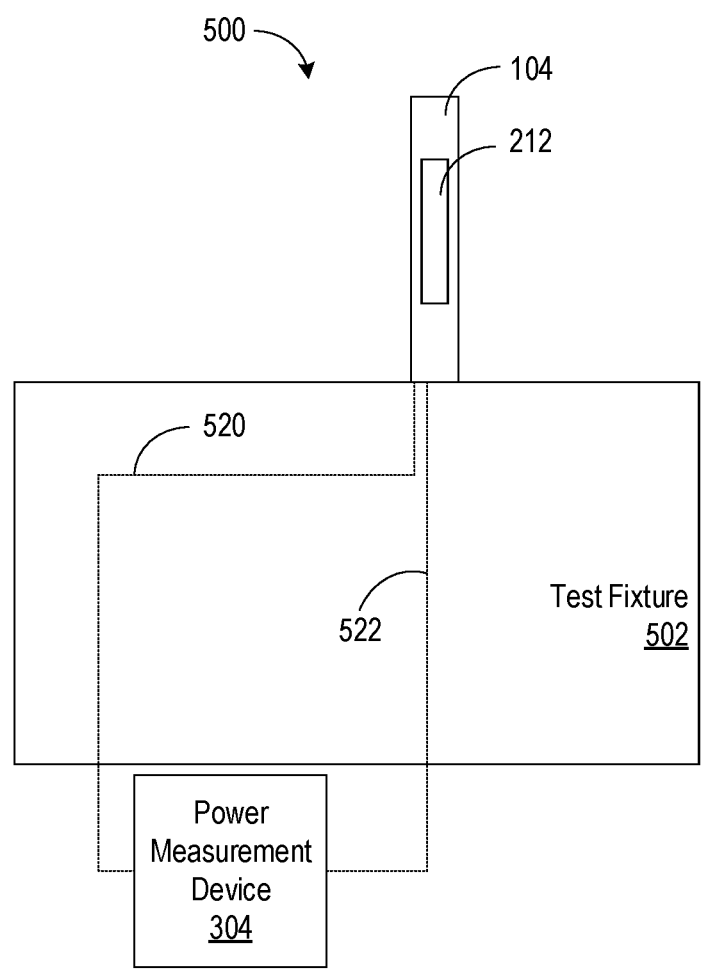
FIG. 5 is a block diagram of yet another power unit testing device, according to a particular embodiment.

Referring to FIG. 5, a block diagram of yet another power unit testing device 500 is shown, according to a particular embodiment. The power unit testing device 500 includes a test fixture 502, which further includes a first lead 520 and a second lead 522. The test fixture 502 can comprise any mechanical structure configured to contain and/or secure components of the testing device 500.

In some embodiments, the power unit 104 does not include any electrical modulation devices that create difficulty in directly measuring the power remaining in the power source 212. Furthermore, the power unit 104 may not include a flow sensor to detect when a vacuum is induced. In such embodiments, the power unit 104 is constantly providing the full power from the power source 212.

In operation, a user desiring to test the power remaining in the power unit 104 couples the power unit 104 to the test fixture 502. The power unit 104 can be coupled to the test fixture 502 directly. In some embodiments, the power unit 104 is coupled to the test fixture 502 indirectly (e.g., via an adaptor configured to receive the power unit 104 and couple with the vacuum line 310 and the first lead 520 and second lead 522). In some embodiments, one or more adaptors of varying shapes and sizes can be removably coupled to the test fixture 302 such that power units of corresponding shapes and sizes can be tested using the test fixture 302. Because the power unit 104 does not require activation to provide the full power from the power source 212, the power measurement device 304 may measure the power remaining in the power source 212 when the power unit 104 is coupled to the test fixture 502. The power unit testing device 500 can be verified as described.

In some embodiments, the test fixture 502 can be arranged to test a plurality of power units 104 concurrently, as described with reference to FIG. 4. Because the test fixture 502 does not include a vacuum source like the test fixture 402, modifying the test fixture 502 to accommodate a plurality of power units 104 does not require providing a vacuum source 306.

Figure 6:
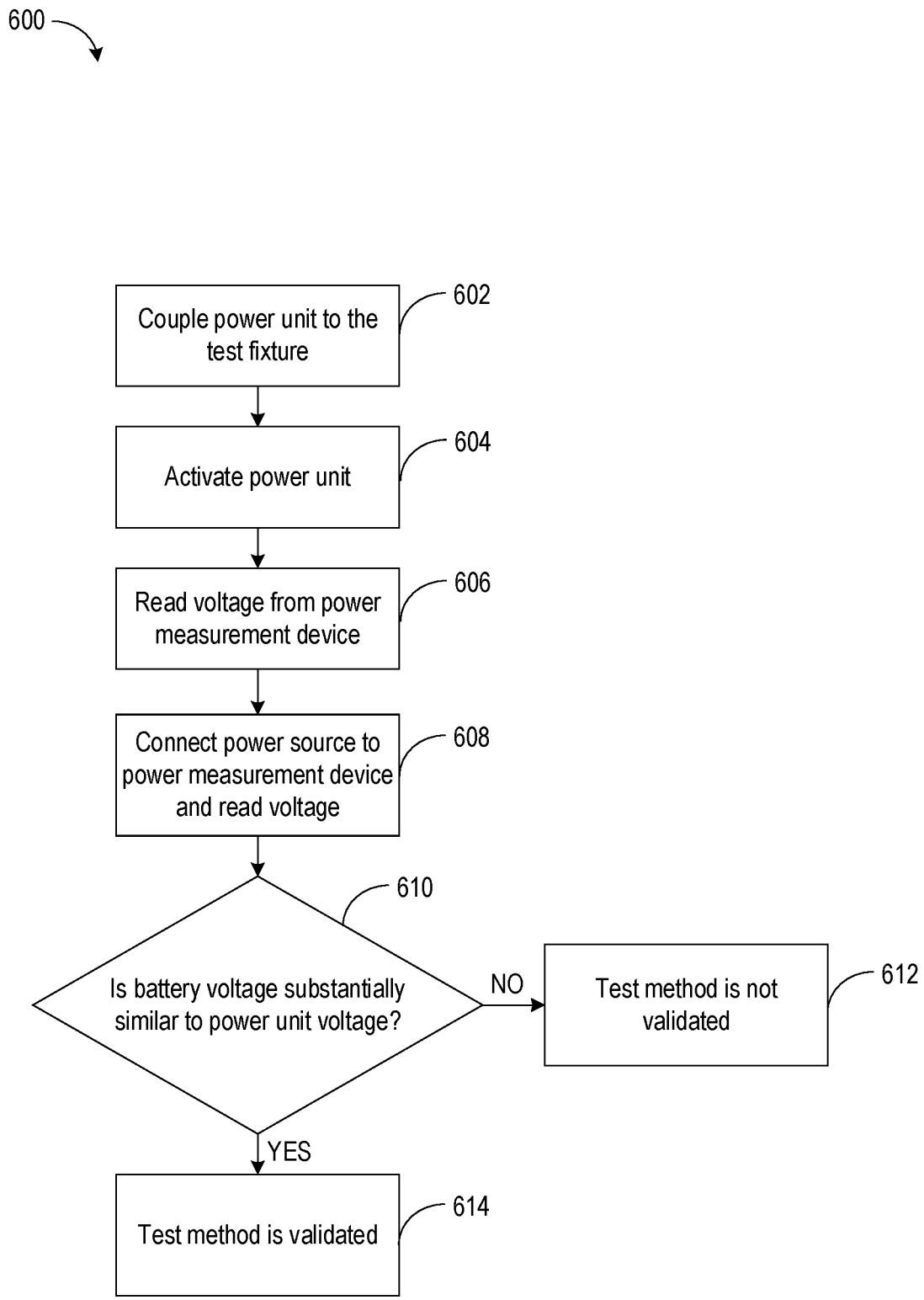
FIG. 6 is a flow diagram illustrating an example method of verifying the power unit testing devices of FIGS. 2-4.

Referring to FIG. 6, a flow diagram illustrating a method 600 of verifying the power unit testing devices of FIGS. 3-5 is shown, according to a particular embodiment. The method 600 begins and the power unit is coupled to the test fixture (action 602). For example, the power unit 104 is coupled to the test fixture 302. The power unit 104 can be coupled directly to the test fixture 302 or the power unit 104 can be coupled to the test fixture 302 via an adaptor. In some embodiments, one or more adaptors of varying shapes and sizes can be removably coupled to the test fixture 302 such that power units of corresponding shapes and sizes can be tested using the test fixture 302.

The power unit is then activated (action 604). For example, in some embodiments the vacuum source 306 is activated and induces a vacuum in the power unit 104, which activates the power unit 104 (e.g., as described with reference to FIGS. 3-4). The power unit 104 may also not require vacuum to be activated, as described with reference to FIG. 5.

The voltage is then read from the power measurement device (action 606). For example, the power measurement device 304 detects the power remaining in the power source 212 and displays the measurement.

The power source 212 is then connected to the power measurement device (action 608). For example, the power source 212 is removed from the power unit 104 and connected directly to the power measurement device 304. The power measurement device 304 displays the remaining power in the power source 212. In some embodiments, the power measurement device 304 can provide the power output in a variety of ways, as previously described with respect to FIG. 3.

The remaining power measured in action 606 is then compared to the remaining power measured in action 608 to determine if the measurements are substantially similar (action 610). For example, the remaining power measured in action 606 may be 3.957 volts (V) and the remaining power measured in action 608 may be 3.7 V. Because the remaining power measured in action 606 is not within the predetermined amount (e.g., within 1 millivolt) of the remaining power measured in action 608, the method 600 is not verified (action 612). As another example, the remaining power measured in action 606 may be 3.957 V and the remaining power measured in action 608 may be 3.958 V. Because the remaining power measured in action 606 is substantially similar to the remaining power measured in action 608, the method 600 is verified (action 614), and the method 600 can be used to determine how much power remains in the power source 212 without removing the power source 212 from the power unit 104.

Figure 7:
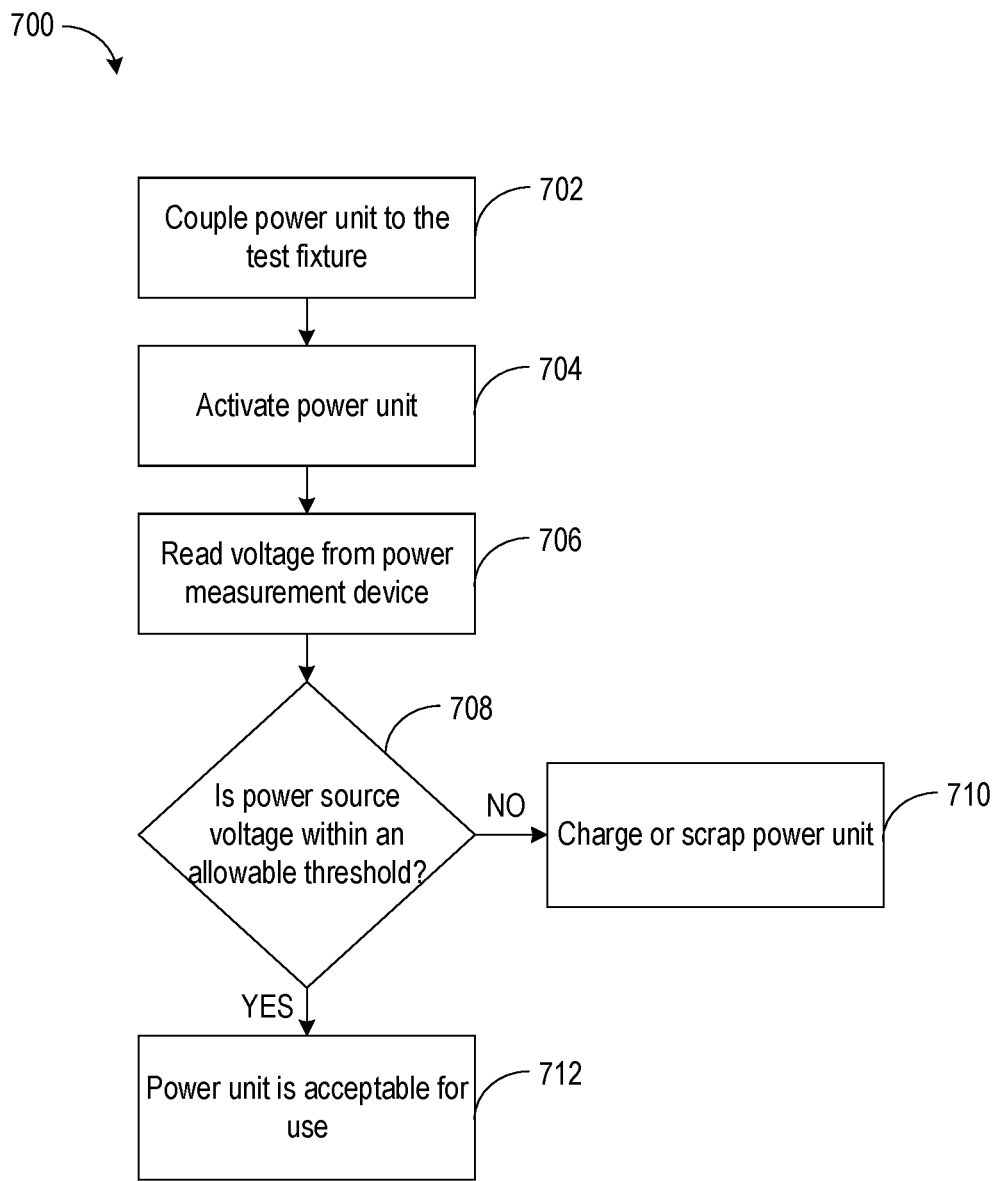
FIG. 7 is a flow diagram illustrating an example method of testing a power unit.

Referring now to FIG. 7, a flow diagram illustrating a method 700 of testing a power unit is shown, according to a particular embodiment. The method 700 can be implemented after the method 600 is verified, for example. The method 700 begins and the power unit is coupled to the test fixture (action 702). For example, the power unit 104 is coupled to the test fixture 302. The power unit 104 can be coupled directly to the test fixture 302 or the power unit 104 can be coupled to the test fixture 302 via an adaptor.

The power unit is then activated (action 704). For example, in some embodiments the vacuum source 306 is activated and induces a vacuum in the power unit 104, which activates the power unit 104 (e.g., as described with reference to FIGS. 3-4). The power unit 104 may also not require vacuum to be activated, as described with reference to FIG. 5.

The voltage is then read from the power measurement device (action 706). For example, the power measurement device 304 detects the power remaining in the power source 212 and displays the measurement.

A determination is then made as to whether the power source voltage is within an allowable threshold (action 708). For example, a manufacturer may determine that the power unit 104 must be charged with at least 3.5 V of power to be included in a finished product. If the power measurement device 304 shows that the power unit 104 has a charge of only 3 V, the manufacturer can choose to charge the power unit 104 until the charge reaches an acceptable level, scrap the power unit 104 (action 710), or repair and/or replace components of the power unit 104 such that the power unit 104 functions properly. If the power measurement device 304 shows that the power unit 104 has a charge of 3.9 V, the power unit 104 is acceptable for use (action 712) and the manufacturer can include the power unit 104 in a finished product.

In some arrangements, multiple thresholds can be used to make determinations based on the power remaining in the power unit 104. For example, a manufacturer may determine that the power unit 104 must be charged with at least a first threshold (e.g., 3.5 V) of power to be included in a finished product. In addition, the manufacturer may determine that if the power unit 104 is charged with less than a second threshold that is less than the first threshold (e.g., 2.0 V) of power, the power unit 104 is no longer capable of carrying a full charge and other actions must be taken (e.g., the power unit 104 can be discarded, or components of the power unit 104 can be repaired and/or replaced to increase the functionality of the power unit 104). If the power unit 104 includes a charge between the first and second thresholds (e.g., between 2.0 V and 3.5 V), the manufacturer can charge the power unit 104 until the charge reaches an acceptable level. It will be understood that the values described above are for example purpose only, and acceptable power levels may change based on a variety of factors.

As utilized herein, the term "substantially," and similar terms are intended to have a broad meaning in harmony with the common and accepted usage by those of ordinary skill in the art to which the subject matter of this disclosure pertains. It should be understood by those of ordinary skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the invention as recited in the appended claims.

Although only a few embodiments have been described in detail in this disclosure, those skilled in the art who review this disclosure will readily appreciate that many modifications are possible (e.g., variations in sizes, dimensions, structures, shapes, and proportions of the various elements, values of parameters, mounting arrangements, use of materials, colors, orientations, etc.) without materially departing from the novel teachings and advantages of the subject matter described herein. For example, elements shown as integrally formed may be constructed of multiple components or elements, the position of elements may be reversed or otherwise varied, and the nature or number of discrete elements or positions may be altered or varied. The order or sequence of any method processes may be varied or re-sequenced according to alternative embodiments. Other substitutions, modifications, changes, and omissions may also be made in the design, operating conditions and arrangement of the various exemplary embodiments without departing from the scope of the present invention.

What is claimed is:

1. A system for testing an aerosol delivery device, comprising:
   a test fixture configured to couple to a power unit for the aerosol delivery device, the test fixture comprising a power storage device configured to electrically couple to the power unit, the power storage device configured to store power corresponding to an amount of power remaining in a power source disposed within the power unit;
   a vacuum source configured to fluidly couple to the power unit, the vacuum source configured to induce a vacuum within the power unit; and
   a power measurement device electrically coupled to the power storage device and thereby the test fixture, the power measurement device configured to measure the power stored in the power storage device corresponding to the amount of power remaining in the power source disposed within in the power unit.

2. The system of claim 1, wherein the vacuum source is configured to fluidly couple to the power unit via a cartridge for the aerosol delivery device.

3. The system of claim 2, wherein the vacuum source is configured to fluidly couple to a plurality of power units via a plurality of cartridges associated with a plurality of aerosol delivery devices.

4. The system of claim 2, further comprising a first vacuum line and a second vacuum line, the first vacuum line configured to fluidly couple to the cartridge and the vacuum source, the second vacuum line configured to fluidly couple to the cartridge and the power unit.

5. The system of claim 4, wherein the second vacuum line is configured to be in fluid communication with a flow sensor disposed within the power unit.

6. The system of claim 5, wherein upon the flow sensor detecting a vacuum, the power unit is activated.

7. The system of claim 4, wherein one or more of the first vacuum line or the second vacuum line comprises a restrictor, the restrictor configured to reduce the vacuum induced by the vacuum source.

8. The system of claim 1, wherein the power storage device is configured to store an electrical charge based on the amount of power remaining in the power source disposed within the power unit.

9. The system of claim 8, wherein the power measurement device is configured to measure the electrical charge stored on the power storage device, the electrical charge measured in volts.

10. A system for testing an aerosol delivery device, comprising:
   a test fixture configured to couple to a power unit for the aerosol delivery device;
   a vacuum source configured to fluidly couple to the power unit, the vacuum source configured to induce a vacuum within the power unit; and
   a power measurement device configured to electrically couple to the power unit via the test fixture, the power measurement device configured to measure an amount of power remaining in a power source disposed within the power unit.

11. The system of claim 10, wherein the vacuum source is configured to fluidly couple to the power unit via a cartridge for the aerosol delivery device.

12. The system of claim 11, wherein the vacuum source is configured to fluidly couple to a plurality of power units via a plurality of cartridges for a plurality of aerosol delivery devices.

13. The system of claim 11, further comprising a first vacuum line and a second vacuum line, the first vacuum line configured to fluidly couple to the cartridge and the vacuum source, the second vacuum line configured to fluidly couple to the cartridge and the power unit.

14. The system of claim 13, wherein the second vacuum line is configured to be in fluid communication with a flow sensor disposed within the power unit.

15. The system of claim 14, wherein upon the flow sensor detecting a vacuum, the power unit is activated.

16. The system of claim 13, wherein one or more of the first vacuum line or the second vacuum line comprises a restrictor, the restrictor configured to reduce the vacuum induced by the vacuum source.

17. The system of claim 10, wherein the test fixture includes a power storage device configured to electrically couple to the power unit and the power measurement device, and the power storage device is configured to store an electrical charge corresponding to the amount of power remaining in the power source, and
   wherein the power measurement device configured to measure the amount of power remaining in the power source includes the power measurement device configured to measure the electrical charge stored on the power storage device.

18. A method for verifying an aerosol delivery device testing system, the method comprising:
   coupling a power unit of the aerosol delivery device to a test fixture comprising a power measurement device and a power storage device, the power unit comprising a power source and a flow sensor;
   activating the power unit wherein power accumulates in the power storage device;
   measuring, by the power measurement device, the power accumulated in the power storage device corresponding to an amount of power remaining in the power unit;
   measuring, by the power measurement device, an amount of power remaining in the power source; and
   indicating, if the measured amount of power remaining in the power source is within a predetermined amount of the measured amount of power remaining in the power unit, the method is valid.

19. The method of claim 18, wherein the predetermined amount is one millivolt.

20. The method of claim 18, wherein activating the power unit comprises inducing a vacuum in the power unit, the induced vacuum being sensed by the flow sensor.

21. The method of claim 20, wherein coupling the power unit to the test fixture comprises coupling the power unit to an adaptor that is coupled to the test fixture.

22. The method of claim 20, wherein coupling the power unit to the test fixture comprises coupling the power unit directly to the test fixture.

* * * * *